Feb. 26, 1963 K. E. JANKE ET AL 3,079,572

CORE TUNED INDUCTOR WITH SPRING BIASED CORD OPERATOR

Filed June 8, 1960

INVENTORS
KURT E. JANKE
ROBERT C. SIMMONS
BY Albert H. Garland
ATTORNEY 3,079,572

CORE TUNED INDUCTOR WITH SPRING BIASED CORD OPERATOR

Kurt E. Janke, Philadelphia, and Robert C. Simmons, Levittown, Pa., assignors, by mesne assignments, to Philco Corporation, Philadelphia, Pa., a corporation of Delaware Filed June 8, 1960, Ser. No. 34,676
3 Claims. (Cl. 334—70)

The present invention relates generally to mechanism for driving the tuning means of radio receivers and for indicating the setting of the tuning means.

More particularly the invention has to do with an improved and novel arrangement for effecting adjustments of the tuning means of a combined AM–FM receiver to tune the same to desired wavelengths within the AM and FM band, and for giving visual indication of the wavelength to which the receiver is tuned.

As is well known, it is the customary practice to provide a combined AM–FM receiver with two tuning devices, one serving to tune the receiver for the reception of amplitude modulated carrier waves, the other serving to tune the receiver for the reception of frequency modulated carrier waves. As is also well known, it is expedient and desirable to employ a variable capacitance tuner for effecting continuous tuning of the receiver within the AM band, and to employ a variable inductance tuner for effecting continuous tuning of the receiver within the FM band. Moreover, for simplicity of construction and ease of operation, it is preferred to associate these two tuners in such manner that a single manipulator serves to control the setting of both tuners.

The use of a single setting indicator for the two tuners results in complications and particularly is this the case when associated capacitance and inductance devices are employed for tuning purposes. It is a primary object of the present invention to overcome these difficulties and complications.

It is also an object of the present invention to provide an improved and novel arrangement whereby the tuning means of a combined AM–FM radio receiver may readily and quickly be adjusted with respect to each other and also with respect to a tuning indicator common to the two tuning means.

Another object of the invention is to provide a simplified system whereby tuning of a combined AM–FM receiver to any wavelength within the AM and FM bands can be accurately indicated on a single dial and by means of a single pointer.

The invention is particularly characterized by the provision of a system which insures extremely fine and progressive adjustments of the tuning instrumentalities of an inductance FM tuner so that its setting can be exactly and accurately aligned with the setting of the tuning instrumentalities of a capacitance AM tuner.

The invention, in its broader aspect, is further characterized by the provision of a combined AM–FM receiver in which simple elements cooperate in a simplified manner to establish and maintain proper relationship between tuning instrumentalities, and in which a position indicator always accurately indicates the exact setting of such instrumentalities.

Briefly stated, the above noted objects and characteristic features of the invention are achieved by utilizing novel drive cord means in combination with simply constructed means operable to effect alignment of the tuning instrumentalities for adjustment in proper relationship with respect to a setting indicator therefor.

The invention, as well as its objectives and characteristic features, will be more fully understood from the following description of a preferred embodiment which is illustrated in the accompanying drawing. In these drawings.

Figures 1, 5:
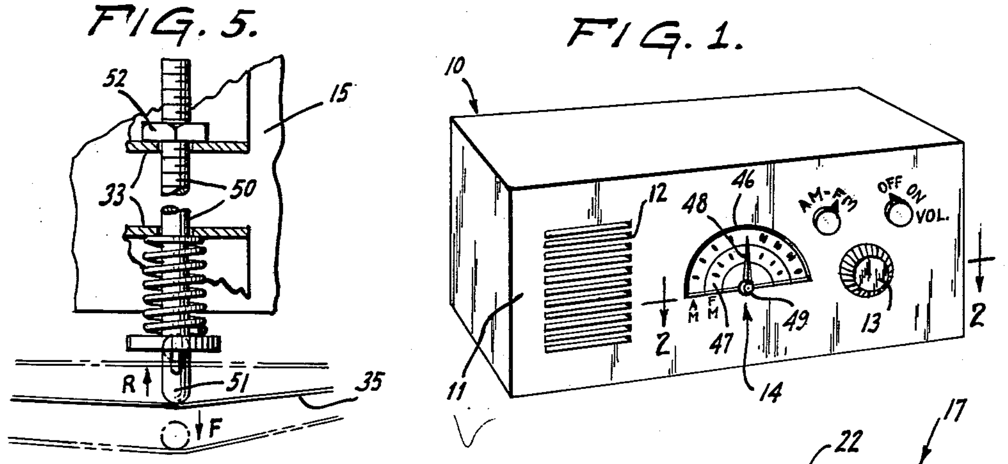
FIGURE 1 is a perspective view of a combined AM–FM radio receiver incorporating a tuner drive and indication mechanism constructed in accordance with the principles of the present invention.
Figures 2, 3, 4, 6:
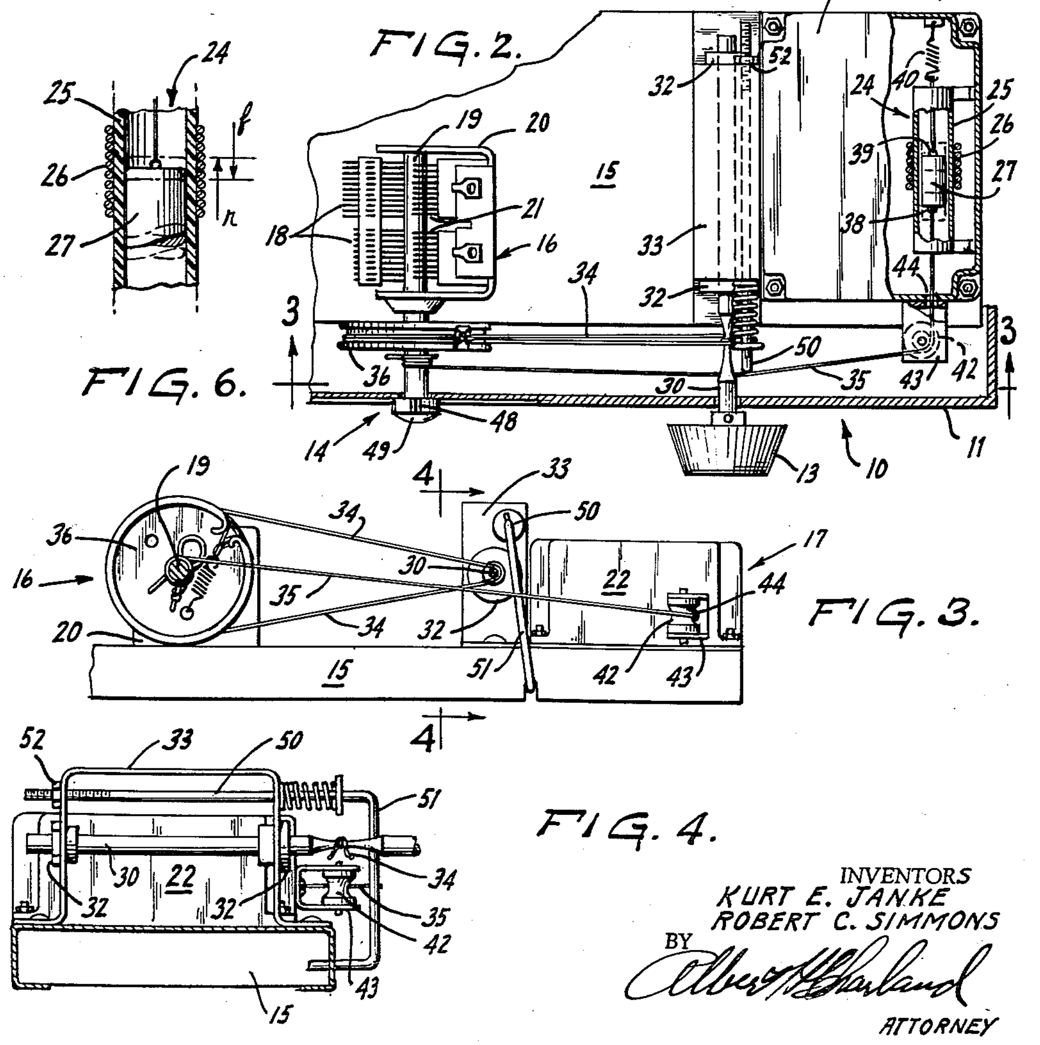
FIGURE 2 is an enlarged sectional view looking generally in the direction of arrows 2—2 in FIGURE 1.
FIGURE 3 is a sectional view taken substantially along line 3—3 of FIGURE 2, with the chassis removed from the cabinet.
FIGURE 4 is a sectional view taken on line 4—4 of FIGURE 3.

FIGURE 5 is an enlarged fragmentary view of parts as shown in FIGURE 2, and illustrating the arrangement which in accordance with the invention is adjustable to effect aligning adjustments of the inductance FM tuner; and FIGURE 6 is an enlarged fragmentary view of portions of the inductance tuner shown in FIGURE 2 and illustrating adjustments of the sliding core in response to adjustments of the arrangement illustrated in FIGURE 5.

Having more particular reference to the drawing, there is illustrated in FIGURE 1 a conventional AM–FM radio receiver which comprises a cabinet 10 having a front wall 11 provided with a speaker grill 12 and accommodating various controls of the receiver, including a tuner-actuating knob 13 and a tuner-setting indicator means 14. As shown in FIGURE 2, the cabinet 10 encloses a chassis 15 which is of usual construction and carries the customary electronic components including an AM tuner assembly 16 and a FM tuner assembly 17.

The AM tuner assembly 16 is of the conventional variable capacitor type. It is constructed with rotor plates 18 carried by a shaft 19, the latter being rotatably supported in a frame 20 on the chassis 15 so as to displace said rotor plates between and with respect to stator plates 21 fixed in said frame. This displacement of the rotor plates results in varying the capacitance and thus effects tuning of the receiver to the desired wavelength in the AM band.

The FM turner assembly is of the conventional variable inductor type and comprises a casing 22 housing the usual components including inductance coil unit 24. This unit, as is customary, includes a tubular non-conductive form 25 on which a conductive wire coil 26 is wound and within which a conductive core 27 is slidably received. The core 27 is slidable inwardly and outwardly of the coil 26 thus varying the inductance and effecting tuning of the receiver to the desired wavelength within the FM band.

In accordance with the present invention, the rotor shaft 19 of the AM tuner assembly and the slidable core 27 of the FM tuner assembly are actuated in response to manipulation of the single knob 13. For that purpose and as clearly seen in FIGURE 2, the knob 13 is affixed on a drive spindle 30 extending through the cabinet front wall 11, and a cord drive arrangement drivingly connects said spindle to said rotor shaft 19 and to said slidable core 27. As shown in FIGURES 2–4, the drive spindle 30 is rotatably journalled in bushings 32 supported in a frame 33 mounted on the chassis 15, and the drive arrangement consists of two cords 34 and 35. The cord 34 is wound on the drive spindle 30 and about a pulley 36 rigidly secured on the rotor shaft 19, whereas the cord 35 is wound about said shaft 19 and is connected to the slidable core 27 at the forward end 38 thereof, the rearward end 39 of said core being connected to a tension spring 40 which normally urges said core inwardly of the inductance coil 26.

From the foregoing description it will be understood that manipulation of the knob 13 to rotate the spindle 30 in counterclockwise direction as viewed in FIGURES 2 and 3, will result in driving the cord 34 to rotate the associated pulley 36 and rotor shaft 19 in counterclockwise direction, whereas manipulation of the knob 13 in clockwise direction as viewed in said FIGURES 3 and 4 will result in driving the cord 34 to rotate the pulley 36 and rotor shaft 19 in said clockwise direction. It will also be understood that rotation of the rotor shaft 19 in the aforesaid counterclockwise direction will further result in winding the cord 35 about said shaft thus pulling the cord 27 against the spring 40 to displace said core outwardly with respect to the inductance coil 26, whereas rotation of the rotor shaft 19 in the aforesaid clockwise direction will let out the cord 35 thereby permitting the core 27 to move inwardly with respect to said coil 26 under influence of said spring 40. In the illustrated embodiment the cord 35 is guided in its winding and unwinding motion by means of a guide roller 42 supported in a bracket 43 arranged on the casing 22, the latter being provided with an aperture 44 through which said cord 35 passes.

In further accordance with the present invention, the indicator means 14 is adapted to indicate the setting of both the AM tuner shaft 19 and the FM tuner core 27. For that purpose there is provided indicia means consisting of an AM scale 46, an FM scale 47, and a pointer 48 associated with both scales. In the illustrated embodiment, the AM and FM scales are arranged about an extended end portion 49 of the aforesaid tuner shaft 19 which projects through the front wall of the cabinet 10, and the pointer 48 is affixed to said end portion of said shaft. Thus the pointer 48 swings in unison with rotation of the AM tuner shaft 19 and with sliding motion of the FM tuner core 27 upon manipulation of the knob 13.

In order that the pointer 48 may accurately indicate the exact positions of both the AM tuner shaft 19 and the FM tuner core 27, there is provided means whereby said shaft and core may be aligned with respect to each other. In the illustrated embodiment, this alignment means comprises a spring-loaded rod 50 slidably supported in the bracket 43 and having a forwardly disposed portion 51 engaging the cord 35 at a point between the tuner shaft 19 and the guide roller 42. The rod 50 is provided with a screw threaded element such as a nut 52 in abutting engagement with the bracket 33. Because of the foregoing arrangement it will be understood that upon rotating the threaded element or nut 52 in one direction, for example in clockwise direction as viewed in FIGURE 5, the spring-loaded rod 50 is drawn in the direction represented by arrow R thus relaxing the cord 35 and allowing the spring 40 to pull the core 27 inwardly with respect to the inductance coil 26, as is represented by the arrow *r* in FIGURE 6. Upon rotation of the nut 52 in the opposite direction, for example in counterclockwise direction as viewed in FIGURE 5, the spring-loaded rod 50 slides in the direction of arrow F thus pushing on the cord 35 thereby exerting a pulling force on the core 27 against the action of the spring 40 and causing said core to move outwardly with respect to the inductance coil 26 as represented by the arrow *f* in FIGURE 6.

By adjusting the core 27 in the manner described above, while the tuner shaft 19 is in precise position to tune the receiver for reception of selected amplitude modulated carrier waves, then the FM tuner can be aligned exactly to tune the receiver for the reception of the frequency modulated carrier wave which corresponds to the selected amplitude modulated carrier wave.

From the foregoing description it will be appreciated that the invention provides an extremely simple and inexpensive arrangement which makes it possible to accurately align the tuning means of a combined AM–FM radio receiver so that proper indications of the wavelength in the AM and FM band to which the receiver is adjusted can be accurately given by means of a single pointer and associated AM–FM indicia dial scales. Although a preferred embodiment has been shown and described in detail, it will be recognized that the invention is not limited to the specific structure of this embodiment, but embraces such changes and such variations as come within the scope of the subjoined claims.

What we claim is:

1. In a radio receiver, tuning apparatus comprising: a tuner having an elongated tuning core mounted to slide longitudinally; a tension spring connected to one end of said core; a cord having two end portions one of which is connected to the other end of said core; a rotatable shaft about which the other end portion of said cord is wound; an elongated rod having a portion disposed to engage said cord at a section intermediate its said end portions, said rod being spring-loaded for longitudinal sliding motion in a direction to bring its said portion into bearing engagement with said intermediate section of said cord; and adjustment means including interengageable abutting members, one of which is carried by and adjustable along said rod to limit the extent of its sliding motion in the aforesaid direction.

2. In a radio receiver, tuning apparatus comprising: a tuner including an elongated tuning core mounted to slide longitudinally, a tension spring connected to one end of said core; a cord having two end portions one of which is connected to the other end of said core; a rotatable shaft about which the other end portion of said cord is wound; an elongated rod having a portion disposed to engage said cord at a section intermediate its end portions, said rod being spring-loaded for longitudinal sliding motion in a direction to bring its said portion into bearing engagement with said intermediate section of said cord; a manually operated rotatable spindle and a second cord wound about said spindle and about said shaft and attached to the latter to transmit thereto the rotational motion of said spindle; and adjustment means including interengageable abutting members, one of which is carried by and adjustable along the said rod to limit the extent of its sliding motion in the aforesaid direction.

3. In a radio receiver, tuning apparatus as defined in claim 2, which further comprises a second tuner which includes the mentioned rotatable shaft, the mentioned manipulator means including a manually operated rotatable spindle and a cord wound about said spindle and about said shaft and attached to the latter to transmit thereto the rotational motion of said spindle.

References Cited in the file of this patent

UNITED STATES PATENTS

| | | |
|---|---|---|
| 1,943,788 | Farnham | Jan. 16, 1934 |
| 2,121,767 | Wroke | June 21, 1938 |
| 2,370,714 | Carlson | Mar. 6, 1945 |
| 2,398,112 | O'Brien | Apr. 9, 1946 |
| 2,839,936 | Dawson | June 24, 1958 |

FOREIGN PATENTS

| | | |
|---|---|---|
| 157,522 | Australia | July 7, 1954 |
| 163,763 | Australia | June 30, 1955 |
| 859,115 | France | Dec. 11, 1940 |
| 975,013 | France | Feb. 28, 1951 |